United States Patent [19]

Landt

[11] Patent Number: 4,506,209
[45] Date of Patent: Mar. 19, 1985

[54] TRACKING IMPEDANCE MEASURING SYSTEM

[75] Inventor: Harvey L. Landt, Cedar Rapids, Iowa

[73] Assignee: Rockwell International Corporation, El Segundo, Calif.

[21] Appl. No.: 453,686

[22] Filed: Dec. 27, 1982

[51] Int. Cl.$^3$ ............................................. G01R 29/22
[52] U.S. Cl. ................................. 324/57 R; 324/58 B
[58] Field of Search .......................... 324/57 R, 58 B; 455/115; 333/17 M

[56] References Cited

U.S. PATENT DOCUMENTS

| | | | |
|---|---|---|---|
| 3,249,863 | 5/1966 | Wright | 324/57 R |
| 3,531,722 | 9/1970 | Seibold | 455/115 |
| 3,704,409 | 11/1972 | Oomen | 324/57 R |
| 4,249,258 | 2/1981 | Craven | 324/58 B X |
| 4,300,092 | 11/1981 | Strenglein | 324/58 B X |
| 4,311,972 | 1/1982 | Landt et al. | 333/17 M |

FOREIGN PATENT DOCUMENTS 0114961 9/1980 Japan .................................. 324/58 B Primary Examiner—Stanley T. Krawczewicz
Attorney, Agent, or Firm—Richard K. Robinson; George A. Montanye; H. Fredrick Hamann

[57] ABSTRACT

A tracking impedance measuring system for measuring the impedance between a signal source such as a radio transmitter and a load such as an antenna includes a directional coupler that obtains a sample of the forward voltage and the reflected voltage. A first discriminator takes the forward voltage samples and the reflected voltage samples and obtains from the sample analog signals that represent the reflected voltage, the forward voltage, and the phase angle between the two voltages. The first discriminator utilizes an injection signal that is provided by a second discriminator which tracks the signal from the signal source but is offset therefrom by a selected frequency.

8 Claims, 3 Drawing Figures

TRACKING IMPEDANCE MEASURING SYSTEM

The U.S. Government has rights in this invention pursuant to Contract No. N00039-80-C-0430 awarded by the Department of the Navy.

BACKGROUND OF THE INVENTION

The invention relates to an impedance measuring system and, in particular, to an impedance measuring system for a radio transceiver.

The measurement of an impedance in a radio transmission system, and in particular, measurement of the impedance between an antenna and a transceiver, presents many problems, including the loading effects that occur during the measurement phase and the fact that the measuring system must be able to provide an accurate measurement regardless of the operating frequency of the radio transceiver. An example of a system that can be used is disclosed in my U.S. Pat. No. 4,311,972 entitled "High Speed Antenna Coupler".

SUMMARY OF THE INVENTION

A tracking impedance measuring system for measuring the impedance between a signal source such as a radio transmitter and a load such as an antenna includes a directional coupler that obtains a sample of the forward voltage and the reflected voltage. A first discriminator takes the forward voltage samples and the reflected voltage samples and obtains from the samples, analog signals that represent the reflected voltage, the forward voltage, and the phase angle between the two voltages. The first discriminator utilizes an injection signal that is provided by a second discriminator which tracks the signal from the signal source but is offset therefrom by a selected frequency.

It is the object of the invention to provide an impedance measuring system that provides an analog signal that represents the reflected voltage, the forward voltage, and the phase angle between the two voltages as well as a signal that represents the frequency of the signal that is provided by the signal source.

It is another object of the invention to provide a tracking impedance measuring system that will automatically track the impedance of a radio transmission system regardless of the frequency of the signal and will respond rapidly when the frequency of the signal that is being transmitted is changed.

BRIEF DESCRIPTION OF THE DRAWINGS

In order that the invention may be readily carried into practice, a number of embodiments will now be described in detail by way of example, with reference to the accompanying drawings in which.

DETAILED DESCRIPTION OF THE PREFERRED EMBODIMENT

Figure 1:
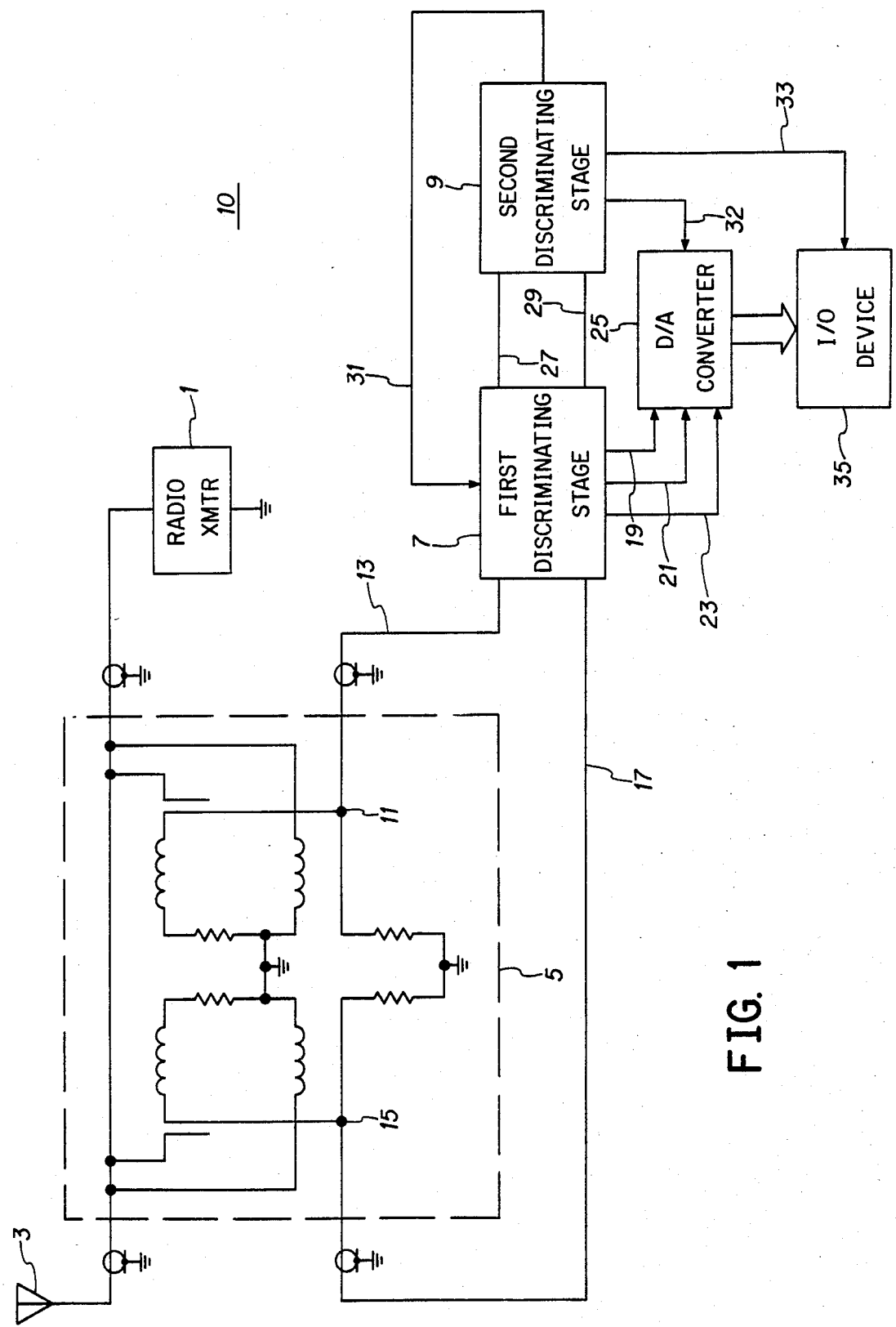
FIG. 1 is a block diagram of the impedance measuring system according to the invention.

In FIG. 1, to which reference should now be made, there is shown a radio transmission system 10 that includes a radio transmitter 1 that transmits and receives radio signals via an antenna 3. An impedance measuring system is disclosed and includes a directional coupler 5, a first discriminator stage 7 and a second discriminator stage 9. Although the unit as shown in FIG. 1 provides for a bidirectional system, the power requirements necessary to operate the circuits normally requires that the impedance measuring system be operated in the transmit mode. The directional coupler 5 obtains a sample of the forward voltage that is applied from the radio transmitter 1 to the antenna 3 at node 11 and applies this voltage sample to the first discriminator via conductor 13. Simultaneously, the directional coupler 5 provides a sample of the reflected voltage on node 15 that is applied to the first discriminator stage 7 via conductor 17. The first discriminator stage 7 obtains, from the sampled forward voltage and the sampled reflective voltage, voltage analogs that represent the reflected voltage, the forward voltage, and the phase difference between these voltages and applies them via conductors 19, 21 and 23 to a D/A converter 25. An I/O device 35 which can be a display panel or a computer uses the provided information to calculate the impedance between the antenna 3 and transceiver 1.

The first discriminator stage passes to the second discriminator stage 9 a signal that represents the radio frequency that is transmitted by the radio transmitter 1 to the antenna 3. This representative signal is provided to the second discriminator stage 9 from the first discriminator stage 7 via conductor 27. The second discriminator stage 9 receives from the first discriminator stage 7 an indication of the forward power that is applied by the radio transceiver 1. The first discriminator stage determines the forward power from the reflected voltage and the forward voltages and provides the forward power indication to the second discriminator stage 9 via conductor 29. The second discriminator stage 9 provides an injection signal to the first discriminator stage 7 via conductor 31. The injection signal is a signal that is identical to the RF signal that is provided by the radio transceiver 1 with the exception that this signal is offset in frequency by a preselected amount. In the preferred embodiment, this preselected amount is 10 KHz. The second discriminator stage also provides to the D/A converter 25 a signal that represents the RF signal via conductor 33. The D/A converter 25 converts the analog signals to digital signals and applies them to an I/O device 35 as was discussed earlier which can be a device such as a microprocessor that can be used to calculate the impedance of the system from the gathered information and a printout terminal or a digital readout meter which would provide the information in a digital version.

Figure 2:
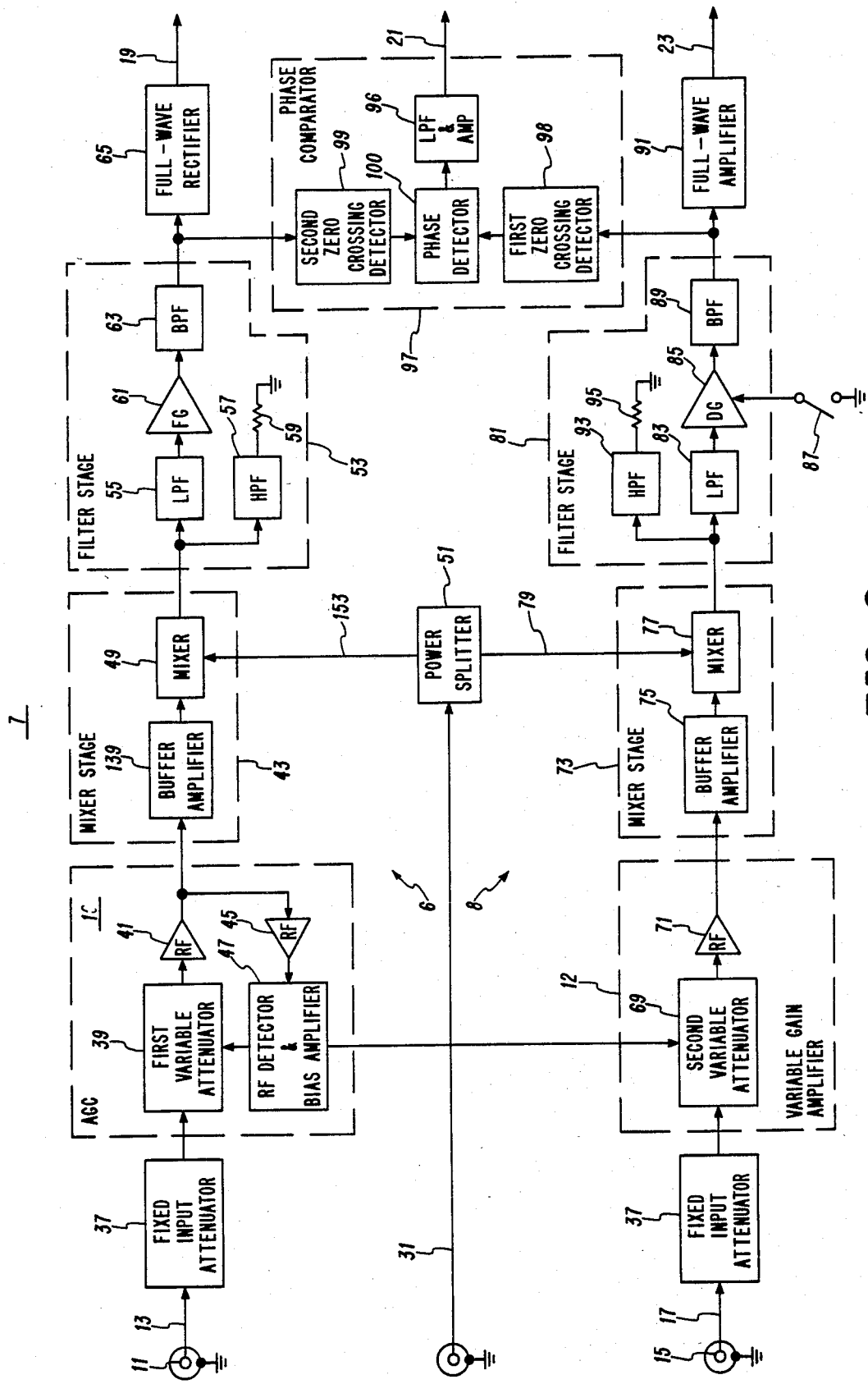
FIG. 2 is a block diagram of the first discriminator.

FIG. 2, to which reference should now be made, is a block diagram of the first discriminating stage 7, which in the preferred embodiment is essentially a dual channel radio receiver. The sampled forward voltage is applied to an Automatic Gain Control (AGC) circuit 10 which is part of the forward voltage channel 6 via conductor 13 and a fixed attenuator 37. Prior to each amplifier there are fixed attenuators 37 used in the circuit for protection of the input to the various amplifiers by attenuating the input signal to an acceptable levels. For simplicity only two such attenuators are shown. An AGC circuit controls both the signal level of the sampled forward voltage as well as the sampled reflected voltage and includes as part of the forward voltage channel a first electronically variable attenuator 39 and amplifier 41, the combination of which comprises a variable gain amplifier. The output of the amplifier 41 is applied to an RF amplifier 45. The output of the RF amplifier 45 is applied to an RF detector and amplifier 47 which converts the sample forward voltage signal to a DC signal whose amplitude varies and which is used to adjust the variable attenuator 39. This automatic gain control maintains the voltage level and provides on the output of the RF amplifier 41 a signal which is representative of the radio frequency signal that is applied to the antenna 3. This signal, which is hereafter referred to as a radio frequency sample or RF sample, is applied to the second discriminator stage via conductor 27. A mixer stage 43 includes a buffer amplifier 139 and a mixer 49 where the sample forward voltage signal is mixed with the injection signal that is provided to the first discriminator stage from the second discriminator stage, and is divided into two signals by a power splitter 51. Conductor 153 applies the divided injection signal to the mixer 49 which mixes the signal with the sample forward voltage that has been amplified by the buffer amplifier 39. The mixed signal is applied to a filter stage 53 for filtering. In the preferred embodiment the output of the mixer 49 is a frequency of 10 KHz and the signal is applied to the filter stage 53 and in particular to a low pass filter 55 which passes the 10 KHz signal. Signals that are above 30 KHz are terminated via a high pass filter 57 and a resistor 59. The output of the low pass filter is applied to a fixed gain amplifier 61 and a bandpass filter 63 which passes the 10 KHz band of frequencies and the signal is rectified by a full wave rectifier 65 to obtain on conductor 19 a voltage analog that represents the voltage of the forward power that is applied to the antenna 3 via the directional coupler 5.

The reflected voltage channel 8 includes a variable gain amplifier 12 which is controlled by the automatic gain control signal that is provided on the output of the RF detector and bias amplifier 47 and applied to the variable gain amplifier 12 via a conductor 67. The variable gain amplifier 12 includes an electronically variable attenuator 69 and an RF amplifier 71. The output of the RF amplifier 71 is applied to the mixer stage 73. The mixer stage 73 includes a buffer amplifier 75 and a mixer 77. The mixer 77 mixes the output of the buffer amplifier which is the reflected voltage sample with the injection signal that is provided by the power splitter 51 via conductor 79. The output of the mixer 77, which here again in the preferred embodiment is a signal that has approximately a 10 KHz frequency is applied to a filter stage 81 that includes a low pass filter 83 which in the preferred embodiment passes signals 10 KHz or less in frequency. The output of the low pass filter 83 is applied to a dual gain amplifier 85 for amplification.

The dual gain amplifier 85 has both a high gain and a low gain setting. When the circuit is initially used and there is a substantial amount of reflected voltage sampled by the directional coupler 3, then the low gain setting on the dual gain amplifier is utilized by the closing of switch 87. However, as the radio transceiver 1 approaches the proper tuned frequency and the impedances are matched and to provide an accurate measurement, the high gain setting of the dual gain amplifier is used by the opening of switch 87 which essentially expands the scale of the reflected voltage measuring circuit.

The output of the dual gain amplifier 85 is applied to bandpass filter 89 which passes the 10 KHz frequency signal. The filtered signal is rectified by a full wave rectifier 91 and a voltage analog of the reflected voltage is provided to the output conductor 23 of the first discriminator card. The output signals from the mixer 77 that are a frequency of 30 KHz or higher are terminated via the high pass filter 93 and the resistor 95.

The phase angle between the two output signals of the filter stages 53 and 81 is obtained by the phase comparator 97 that includes a first zero cross detector 98 that senses every time the alternating current signal that is provided on the output of the bandpass filter 89 crosses the zero voltage potential and similarly a zero crossing detector 99 detects when the output of the bandpass filter 63 voltage level crosses zero. The output of the two zero cross detectors which are logic signals is compared by a phase detector 100 which provides a signal whose length in time represents difference in occurrence of an output pulse from the zero cross detector 99 and the first zero cross detector 98. The output of the phase detector 100 is filtered and amplified by the low pass filter and amplifier 96 and provided on the output conductor 21.

Figure 3:
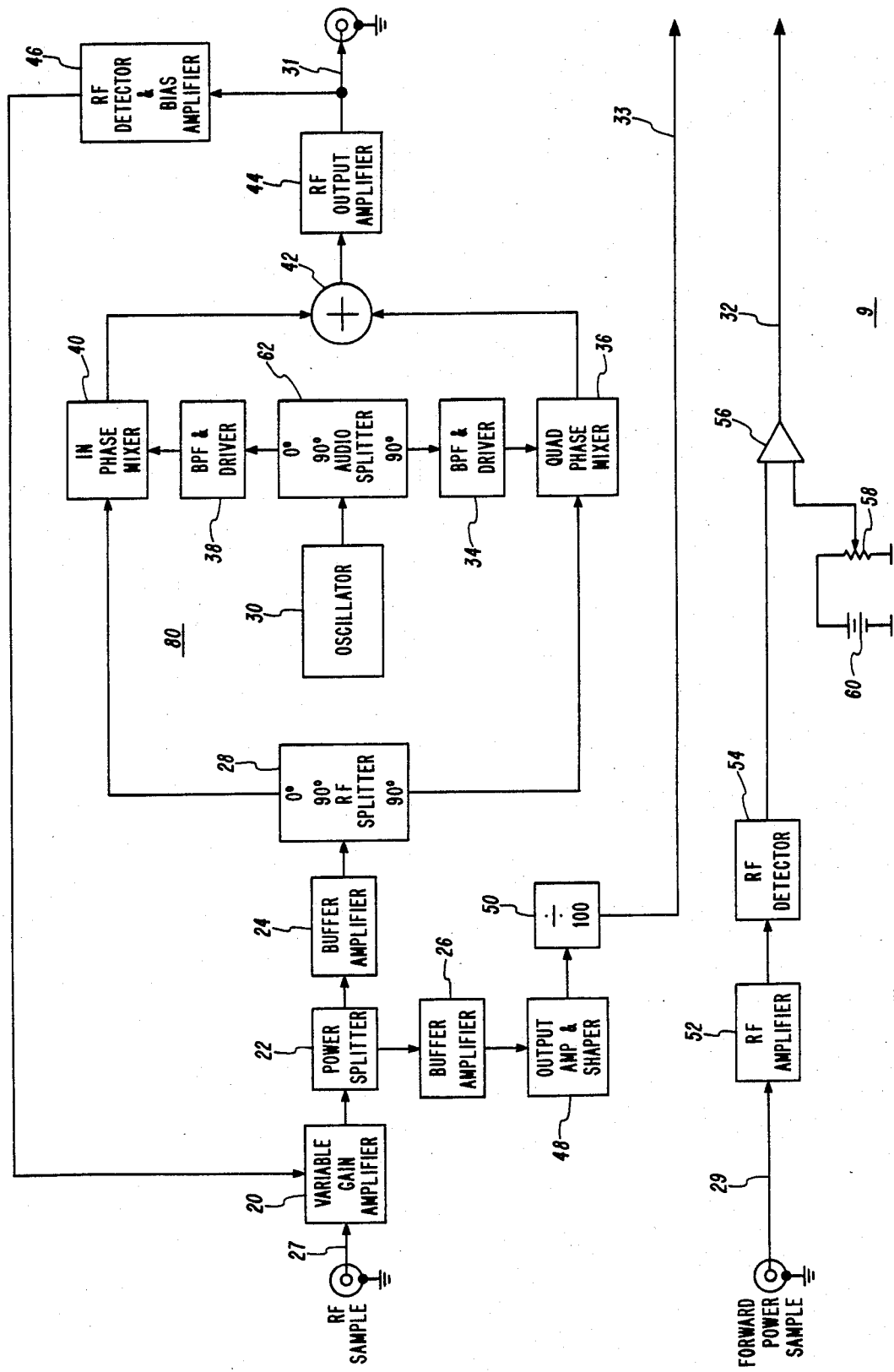
FIG. 3 is a block diagram of the second discriminator of FIG. 1.

FIG. 3, to which reference should now be made, provides a block diagram of the second discriminator stage 9. There are two signals applied from the first discriminator 7 to the second discriminator stage 9. These are the samples of the RF signal which is applied to the second discriminator stage 9 via conductor 27 and a sample of the forward power that is applied to the second discriminator stage 9 via conductor 29. The RF sample is used to generate the injection signal which is a single sideband signal that tracks the RF signal that is applied from the radio transmitter 1 to the load 3, but is offset therefrom by a selected frequency. This frequency offset in the preferred embodiment is 10 KHz. The RF sample is applied to a variable gain amplifier 20 whose output is varied by the injection signal and after amplification is applied to the power splitter 22. The power splitter 22 obtains a sample of the RF signal for generating a representative signal of the frequency of the RF sample that is, in the case of the preferred embodiment, divided by 100. The output of the power splitter to obtain this representative sample is applied to a buffer amplifier 26 and output amplifier and pulse shaper 48 and a divider 50 which divides the signal by 100 and provides on conductor 33 a signal VRF which is a signal that has a frequency that is representative of the R frequency of the RF signal but is divided by 100. This divided signal is applied from the second discriminator stage 33 to the I/O device 35 by conductor 33.

The second output of the power splitter 22 is applied to a buffer amplifier 24 and also to a single sideband generator 80. The single sideband generator 80 uses a phase difference technique to generate the RF signal. The output of the buffer amplifier 24 is applied to a broadband 90° splitter 28 which provides an in-phase signal on its zero terminal and a quadrature phase signal on its 90° terminal. The in-phase signal is applied to an in-phase mixer 40 where it is mixed with a signal that is provided by an oscillator 30 via the zero terminals of a second 90° audio splitter 62 and a 10 KHz bandpass filter and driver. The quadrature phase signal of the RF sample signal is mixed with the quadrature phase signal of the local oscillator signal which is provided on the terminal of the 90° audio splitter 62. The output from the 90° terminal of the 90° audio splitter 62 is applied to a 10 KHz bandpass filter and driver. It should be noted that the 90° audio splitter can be a digital splitter such as an inverter and divider. The outputs of the in-phase mixer 40 and the quadrature phase mixer 36 are combined by combiner 42 and the result of that combination is applied to an RF output power amplifier 44 which provides the drive power for the injection signal that is applied to the first discriminating stage 7 via conductor 31. The output of the RF output amplifier 44 is also applied to an RF detector and bias amplifier 46 for generating the control signal to control the variable gain amplifier 20.

The forward power sample that is applied to the second discriminator stage 9 via conductor 29 passes through an RF amplifier 52 and an RF detector 54. The detected signal is applied to a comparator 56 which compares the detected signal from the RF detector 54 with a reference that is provided by the voltage source 60 and the potentiometer 58. The results of this comparison will indicate, depending on the setting of the threshold which is selectable, whether enough power is present to appropriately operate the impedance measuring stage.

Many changes and modifications in the above described invention can, of course, be carried out without departing from the scope thereof. Accordingly, the invention is intended to be limited only by the scope of the appended claims.

I claim:

1. A tracking impedance measuring system comprising:
    directional coupler means for obtaining forward signal sample representative of the forward power applied from a signal source to a load and a reflected signal sample representative of the reflected power between the load and the signal source;
    first discriminator means for mixing the forward signal sample and the reflected signal sample with an injection signal to obtain a forward signal analog, and a reflected signal analog and an RF signal sample; and
    second discriminator means for generating the injection signal from the RF signal sample.

2. The tracking impedance measuring system according to claim 1 wherein the first discriminator means comprises:
    a forward down converter means for mixing the first injection signal with the forward signal sample to obtain a forward down converted signal;
    first converter means for converting the forward down converted signal into the forward signal analog;
    a reflected down converter means for mixing the reflected signal sample with the second injection signal to obtain a reflected down converted signal; and
    second converter means for converting the reflected down converted signal to the reflected signal analog.

3. The tracking impedance measuring system according to claim 2 further comprising:
    phase detector means for detecting the phase difference between the forward signal analog and the reflected signal analog.

4. The tracking impedance measuring system according to claim 1 wherein the second discriminator means comprises:
    generator means for generating the injection signal which has a constant frequency offset from system operating frequency.

5. A method of measuring impedance comprising:
    obtaining forward signal sample representative of the forward power applied from a signal source to a load and a reflected signal sample representative of the reflected power between the load and the signal source;
    mixing the forward signal sample and the reflected signal sample with an injection signal to obtain a forward signal analog, and a reflected signal analog and an RF signal sample; and
    generating the injection signal from the RF signal sample.

6. The method according to claim 5 wherein the step of mixing the forward signal sample and the reflected signal sample with an injection signal, comprises:
    mixing the first injection signal with the forward signal sample to obtain a forward down converted signal;
    converting the forward down converted signal into the forward signal analog;
    mixing the reflected signal sample with the second injection signal to obtain a reflected down converted signal; and
    converting the reflected down converted signal to the reflected signal analog.

7. The method according to claim 6 further comprising the steps of:
    detecting the phase difference between the forward signal analog and the reflected signal.

8. The method according to claim 6 wherein the steps of generating the injection signal comprises:
    generating the injection signal which has a constant frequency offset from system operating frequency.

* * * * *